United States Patent [19]

Taylor

[11] Patent Number: 5,620,577
[45] Date of Patent: Apr. 15, 1997

[54] SPRING-LOADED MOUNT FOR A ROTATABLE SPUTTERING CATHODE

[75] Inventor: Clifford L. Taylor, Nerstrand, Minn.

[73] Assignee: Viratec Thin Films, Inc., Faribault, Minn.

[21] Appl. No.: 590,811

[22] Filed: Jan. 24, 1996

Related U.S. Application Data

[63] Continuation of Ser. No. 296,295, Aug. 24, 1994, abandoned, which is a continuation-in-part of Ser. No. 174,533, Dec. 30, 1993, abandoned.

[51] Int. Cl.⁶ ................................................. C23C 14/35
[52] U.S. Cl. ................... 204/298.22; 204/298.11
[58] Field of Search ........................ 204/298.11, 298.22

[56] References Cited

U.S. PATENT DOCUMENTS

| | | | |
|---|---|---|---|
| 4,356,073 | 10/1982 | McKelvey | 204/192.12 |
| 4,362,611 | 12/1982 | Logan et al. | 204/298.06 |
| 4,422,916 | 12/1983 | McKelvey | 204/192.12 |
| 4,443,318 | 4/1984 | McKelvey | 204/298.23 |
| 4,445,997 | 5/1984 | McKelvey | 204/298.23 |
| 4,466,877 | 8/1984 | McKelvey | 204/298.23 |
| 5,100,527 | 3/1992 | Stevenson et al. | 204/298.22 |
| 5,108,574 | 4/1992 | Kirs et al. | 204/298.22 |
| 5,200,049 | 4/1993 | Stevenson et al. | 204/298.22 |
| 5,213,672 | 5/1993 | Hartig et al. | 204/298.22 |
| 5,470,452 | 11/1995 | Dickey et al. | 204/298.21 |

OTHER PUBLICATIONS

"Vespel® Shapes", DuPont Co., Apr. 1990.

M. Wright et al., "Design advances and applications of the rotatable cylindrical magnetron," *Journal of Vacuum Science and Technology A.* vol. 4, No. 3, May/Jun. 1986, pp. 388–392.

*Primary Examiner*—Aaron Weisstuch
*Attorney, Agent, or Firm*—Fish & Richardson P.C.

[57] ABSTRACT

A rotatable magnetron cathode has one end adapted to be attached to a drive shaft and a free end supported by a yoke suspended from spring-loaded supporting devices attached to a sputtering chamber wall. A dark space shield is attached to the cathode where the cathode connects to the drive shaft of its motor so as to rotate with the cathode. Another dark space shield is attached at the free end of the cathode with an insulator bearing in between such that the cathode can rotate without causing the shield at its front to also rotate. An insulator pad is placed between the yoke and a metal cover piece attached to the shield at the front so as to keep the frontal dark space shield in an electrically floating condition.

21 Claims, 9 Drawing Sheets

SPRING-LOADED MOUNT FOR A ROTATABLE SPUTTERING CATHODE

This application is a continuation of application Ser. No. 08/296,295, filed Aug. 24, 1994, now abandoned, which is a continuation-in-part of application Ser. No. 08/174,533, filed Dec. 30, 1993, now abandoned.

BACKGROUND OF THE INVENTION

The present invention relates generally to a magnetron sputtering apparatus, and more particularly to rotating magnetron cathodes with a spring-loaded mount.

DC reactive sputtering is a most frequently used deposition process for large area commercial coating applications, such as the application of thermal control coatings to architectural and automobile glazing. In this process, the articles to be coated are passed through a series of in-line vacuum chambers isolated from one another by vacuum locks. This system may be referred to as a continuous in-line system or a glass coater.

Inside the vacuum chambers, a sputtering gas discharge is maintained at a partial vacuum at a pressure of about 3 millitorr. The sputtering gas comprises a mixture of an inert gas, such as argon, with a small proportion of a reactive gas, such as oxygen, for the formation of oxides.

Each chamber contains one or more cathodes held at a negative potential of about −200 to −1000 volts. A layer of material to be sputtered covers the cathode surface. This surface layer is known as the target or the target material. The reactive gas forms the appropriate compound with the target material.

Ions from the sputtering gas discharge are accelerated into the target and dislodge, or sputter off, atoms of the target material. These atoms, in turn, are deposited on a substrate, such as a glass sheet, passing beneath the target. The atoms react on the substrate with the reactive gas in the sputtering gas discharge to form a thin film. It is advantageous to produce the gas discharge in the presence of a magnetic field using an apparatus known as a magnetron with an array of magnets mounted in a fixed position behind the target and the magnetic field causing electrons from the discharge to be trapped in the field and to travel in a spiral pattern, thereby creating a more intense ionization and higher sputtering rates.

The rotary or rotating magnetron, developed to overcome some of the problems inherent in the so-called planar magnetron, uses a substantially cylindrical cathode and target. The target is rotated continually over a magnet array which defines a sputtering zone, such that a new portion of the target is continually presented to the sputtering zone. This has the favorable effects of easing cooling problems and allowing higher operating powers. The rotation of the target also ensures that the erosion zone comprises the entire circumference of the cathode covered by the sputtering zone. This increases target utilization. The rotating magnetron is described further in U.S. Pat. Nos. 4,356,073 and 4,422,916, the entire disclosures of which are hereby incorporated by reference.

The rotating magnetron requires bearings to permit rotation, and vacuum seals for the drive shaft, the electrical conduits and the cooling conduits. Vacuum and rotary water seals have been used to seal around the drive shaft and the conduits which extend between the coating chamber and the ambient environment. Various mounting, sealing and driving arrangements are described in U.S. Pat. Nos. 4,443,318; 4,445,997; and 4,466,877, the entire disclosures of which are also hereby incorporated by reference. These patents describe rotating magnetrons mounted horizontally in a coating chamber and supported at both ends, each end of the cathode being attached to a spindle held by bearings attached to a sputtering chamber sidewall.

The magnetron, however, may be supported at only one end, designated as the drive end, by a cantilever mount. The other end of the cathode may be referred to as the free end. A cantilever mounted magnetron usually includes a bearing housing containing a drive shaft, a rotary vacuum seal, and at least two bearings spaced along the drive shaft, one of which may function as a shaft seal. Cantilever-mounted magnetron removal does not require removal of a difficult to remove sidewall mounting structure to provide the necessary clearance, and cantilever-mounted magnetrons require only one rather than two rotary seals.

A rotating magnetron incorporating a cantilever mounted removable cathode detachable from its bearing assembly is described in U.S. Pat. No. 5,100,527, assigned to the assignee of the subject application, the entire disclosure of which is hereby incorporated by reference. Such a system allows, among other things, the cathode to be removed easily and without special equipment, thus reducing system down time both by reducing the time required to replace a cathode and by making simultaneous removal of two or more cathodes more practical. A cantilever-mounted cathode having low vacuum seal loads is described in U.S. Pat. No. 5,200,049, assigned to the assignee of the subject application, the entire disclosure of which is hereby incorporated by reference.

In general, a dark space shield or sleeve may be concentrically disposed about the cathode body and spaced from its surface to form a gap. The distance across this gap is less than the dark space length. The dark space is the region of gas discharge next to the cathode. Here, the electrons accelerate under an applied operating voltage to become adequately energized to cause ionization of the sputtering gas. The dark space length is a function of the type of sputtering gas, the gas pressure and the applied electric field. The dark space length, for example, may be on the order of three millimeters.

The dark space shield, usually provided with means for attachment to a suitable mounting surface, protects a portion of the cathode body from the gas discharge and resultant ion bombardment. Dark space shields are usually provided at both ends of the cathode. The shield around the drive end of the cathode body should prevent the sputtering gas discharge from contacting that end. For the dark space shields used heretofore at the supported end or ends of the cathode, the mounting surface has been the chamber wall or a flange attached to the chamber wall, such that the dark space shield does not rotate with the cathode. The shield may also be electrically insulated from this mounting surface so that it is electrically isolated therefrom. The shield then floats electrically and acquires an electrical potential of the gas discharge. A preferred material for the shield is stainless steel.

During sputtering, a film of deposited material grows on the dark space shield, usually under tensile or compressive stress. The stress is highest on sharp edges. Eventually the film deposited begins to spall off, beginning usually on such sharp edges and on areas where the film is thickest. If the resulting flakes of material fall onto a substrate, they obstruct deposition on the areas of the substrate that they cover, resulting in defective products. In order to minimize the rate of film growth on a given dark space shield surface, that surface should point in a direction as close as possible to the direction away from the sputtering target.

The spacing between the dark space shield and the cathode must be well controlled to be less than a dark space length and to ensure that the shield does not touch the cathode.

The cantilever mounting arrangement produces a high bearing load, especially if a heavy target material, such as niobium, is used. High bearing loads have a detrimental effect on bearing life. Relieving the load on the bearing using an outboard support must allow for radial displacement of the free end to avoid additional loads.

Accordingly, an object of the present invention is to provide a rotating magnetron cathode with one end adapted to be attached to a spindle and the other end adapted to be supported such that the force on the bearings can be reduced, while maintaining the advantages of cantilever-mounted cathodes.

SUMMARY OF THE INVENTION

The rotating magnetron apparatus of the present invention includes an evacuable chamber containing a cathode. The cathode has a first end detachably attached to a drive shaft and a second end distal from the first end. The second end is supported by spring loaded supporting means attached to a chamber wall. The supporting means allows radial displacement of the second end.

The cathode of the present invention may comprise a cylindrical tubular structure with a first end rotatably supported and a second end distal from the first end. A dark space shield is rotatably mounted onto the cylindrical structure at the second end, without electrical contact to the cylindrical structure.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings.

DETAILED DESCRIPTION OF THE INVENTION

Figure 1:
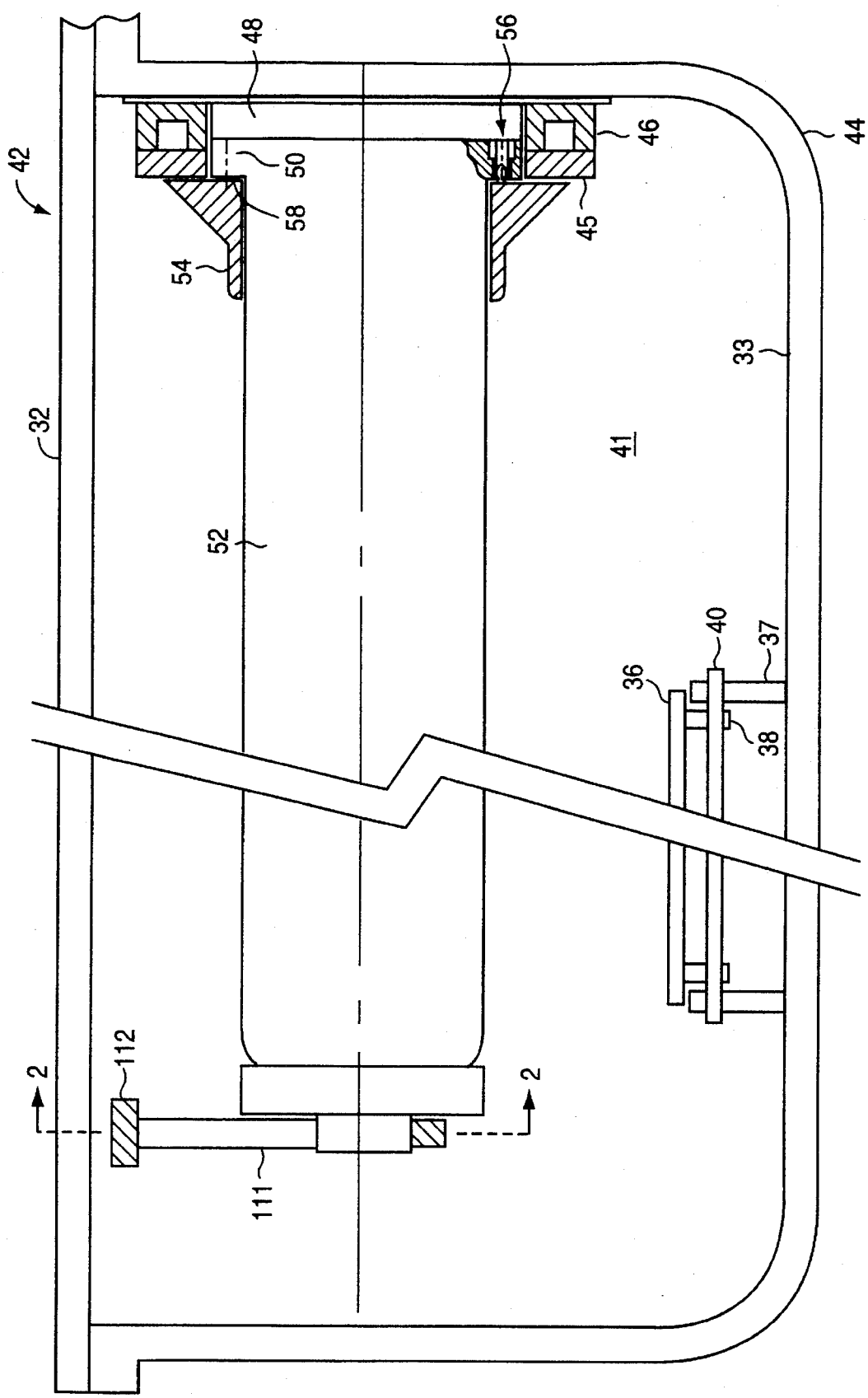
FIG. 1 is a cross-sectional, schematic view of a sputtering chamber containing a rotatable magnetron cathode, taken in a vertical direction parallel to the cathode.
Figure 2:
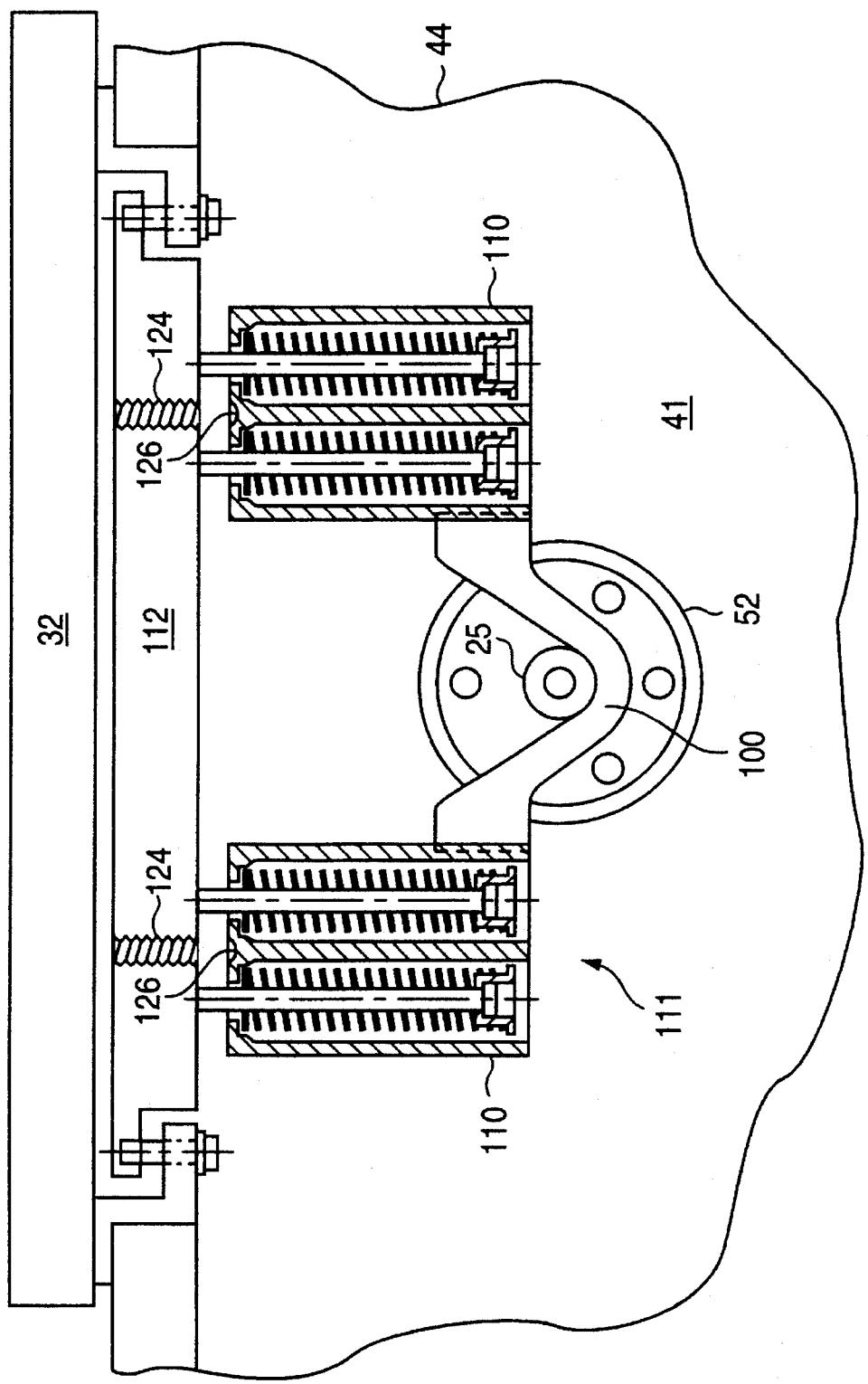
FIG. 2 is a cross-sectional view of the sputtering chamber of FIG. 1 taken along line 2—2 of FIG. 1.

FIGS. 1 and 2 show an evacuable sputtering chamber 41 bounded by walls 44 and sealed by a cover 32, containing a rotatable magnetron apparatus 42 which comprises a tubular cathode 52. A substrate 36 to be coated may be transported through the sputtering chamber 41 on rollers 38 mounted on a spindle 40. The spindle may be supported on bearings 37 attached to a floor 33 of the sputtering chamber 41.

The cathode 52 has its tubular body attached by welding or bolting to a mounting flange 50 at one end, adapted to be connected to a front flange 48 of a drive shaft (shown at 68 in FIGS. 3 and 4) for rotating the cathode 52 around its horizontally extending axis. At the other end, cathode 52 is supported by a spring-loaded mount 111 described in greater detail below. The cathode 52 can be easily removed while leaving the drive shaft 68 in place by immobilizing the spring-loaded mount 111 as described below, and disconnecting the two flanges 50 and 48 which are surrounded by a stationary, water-cooled and electrically grounded water ring 46.

A rotating dark space shield 54 is attached to the cathode 52 so as to rotate therewith. The dark space shield 54 may be attached to the cathode mounting flange 50 by means, for example, of three lock pin and socket assemblies 56 positioned 120° apart from one another around the axis of the cathode 52. Stand-off insulators 58 maintain a minimum spacing between the shield 54 and the flange 50 and may be positioned diametrically opposite the lock pin and socket assemblies 56.

Figure 3:
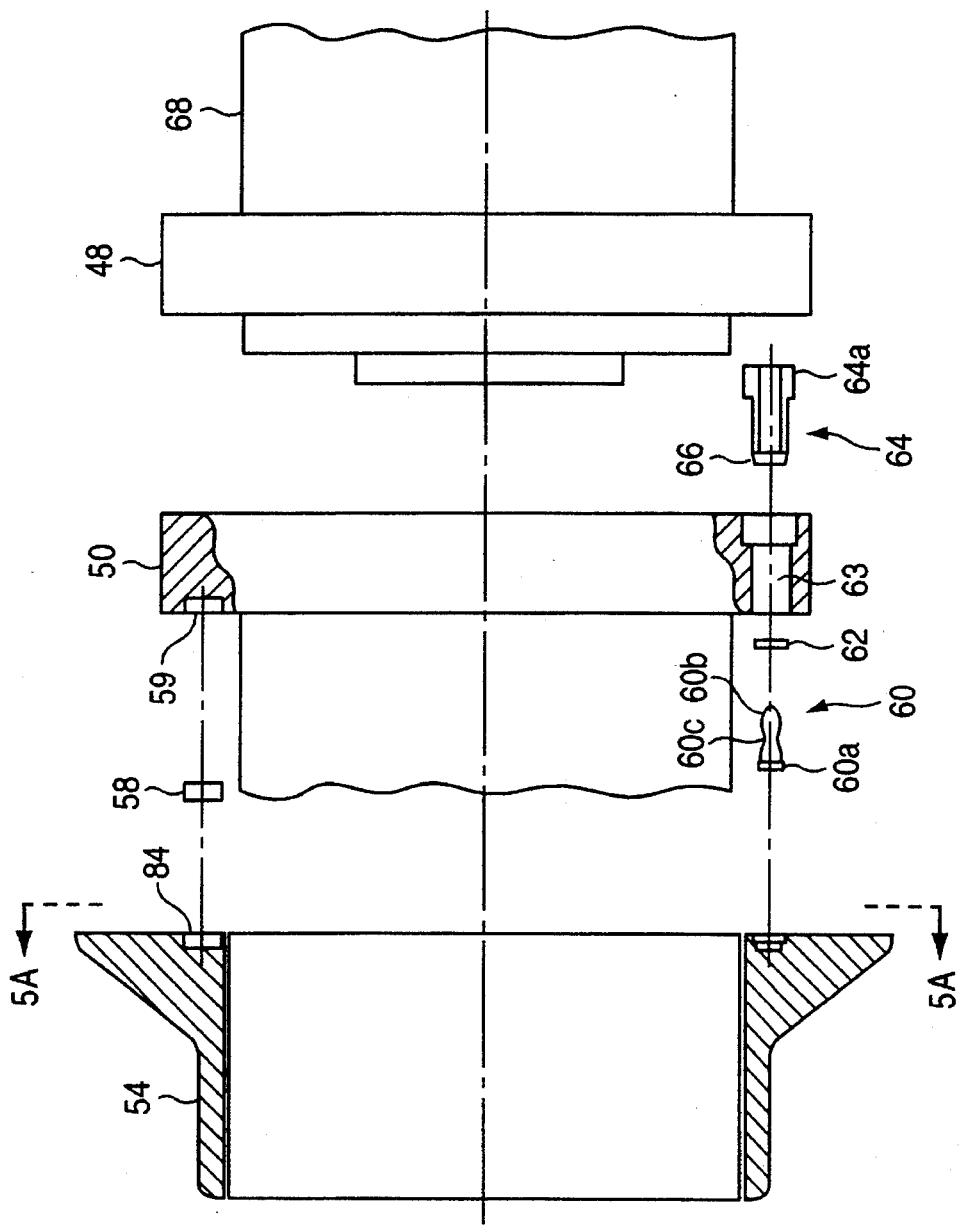
FIG. 3 is a partially sectional, exploded view of the drive end dark space shield assembly of FIG. 1.

FIG. 3 shows more in detail the manner of attaching the shield 54 to the flange 50, sockets 64 and O-rings 66 being inserted into a recess 63 of the cathode flange 50 before mounting the cathode 52 to the drive shaft flange 48, for example, by bolting. Lock pins 60 are secured to the shield 54 using retainers 62, and the O-rings 66 resist deformation of the sockets 64 to thereby improve lock pin retention. After the stand-off electrical insulators 58 are inserted into recesses 59 and 84 in the cathode flange 50 and the dark space shield 54, respectively, the shield 54 is attached to the flange 50 by inserting the pins 60 into the sockets 64.

Arrangements for rotating, cooling and shielding the cathode 52 are explained next with reference to FIG. 4 which, however, will show only the upper half of the portion of the cathode 52 connecting to the drive shaft 68, the lower half being symmetrical to the upper half.

Figure 4:
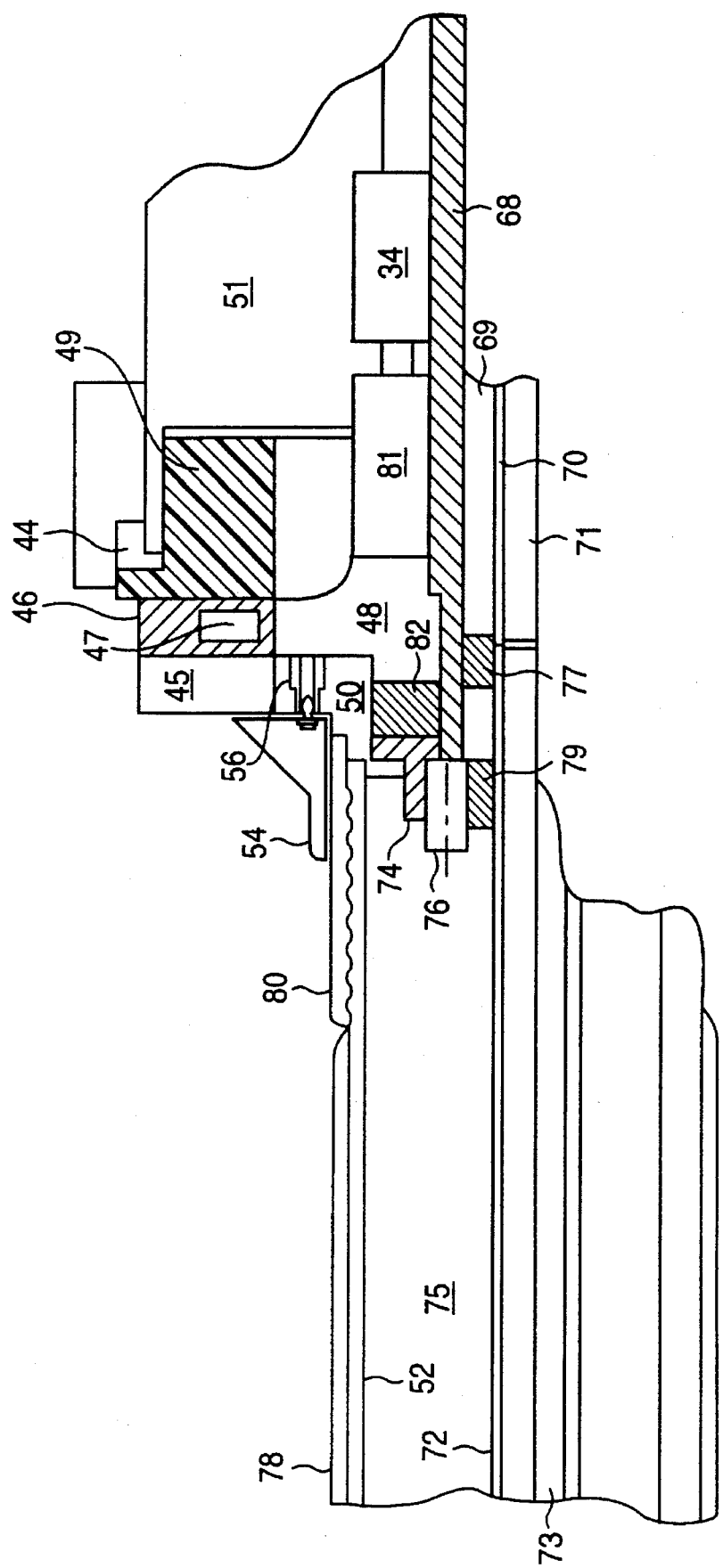
FIG. 4 is a sectional side view of the upper half of an end portion of the cathode of FIG. 1 where it connects the drive shaft.

In FIG. 4, reference numeral 49 indicates a flange which is welded to the chamber wall 44 supporting a bearing housing 51, the cathode 52 and the drive shaft 68. The bearing housing 51 is mounted on the exterior side of the flange 49 relative to the sputtering chamber 41. The water ring 46 with a cooling channel 47 inside is mounted on the interior side of the flange 49 relative to the sputtering chamber 41 and is covered by a cleanable aluminum cover 45. The drive shaft 68 is hollow and is held within the bearing housing 51 by a bearing 34 and is sealed against the bearing housing 51 by a rotary seal 81 or, preferably, a ferrofluidic seal incorporating a colloidal suspension of ultramicroscopic magnetic particles in a carrier liquid. Drive shaft 68 is rotated relative to bearing housing 51 by a motor (not shown). The drive shaft flange 48 is secured to the drive shaft 68 by a nut 82. Concentric with and inside the hollow drive shaft 68 is a cooling fluid transport tube 70 which, together with the drive shaft 68, defines inner and outer cooling fluid conduits 71 and 69, respectively. The fluid transport tube 70 does not rotate with the drive shaft 68 but is held concentric with the drive shaft 68 by a centering ring 77.

Externally, the cathode 52 is covered over most of its length by a target material 78. At either end of the cylindrical sputtering zone, the cathode 52 may be covered with a collar (such as collar 80 of FIG. 4) of a material such as titanium to reduce arcing and increase maximum power as described in U.S. Pat. No. 5,470,452, assigned to the owner of the subject application, the entire disclosure of which is hereby incorporated by reference. The collars 80 may also extend the target life by reducing erosion at the plasma "racetrack"-turnarounds where the power density is greatest.

A check valve 76 for stopping the flow of coolant when the cathode 52 is removed is mounted on a check valve mounting flange 74. Reference numeral 79 indicates a bushing which rotatably supports therein a fluid transport tube 72, which, together with cathode 52, defines inner and outer cooling fluid conduits 73 and 75, respectively. When the cathode 52 is mounted on the drive shaft 68, the check valve mounting flange 74 seals against the drive shaft 68 and the two fluid transport tubes 70 and 72 seal against each other. As a result, the cathode conduits 73 and 75 communicate with the corresponding drive shaft conduits 71 and 69.

Figure 5A:
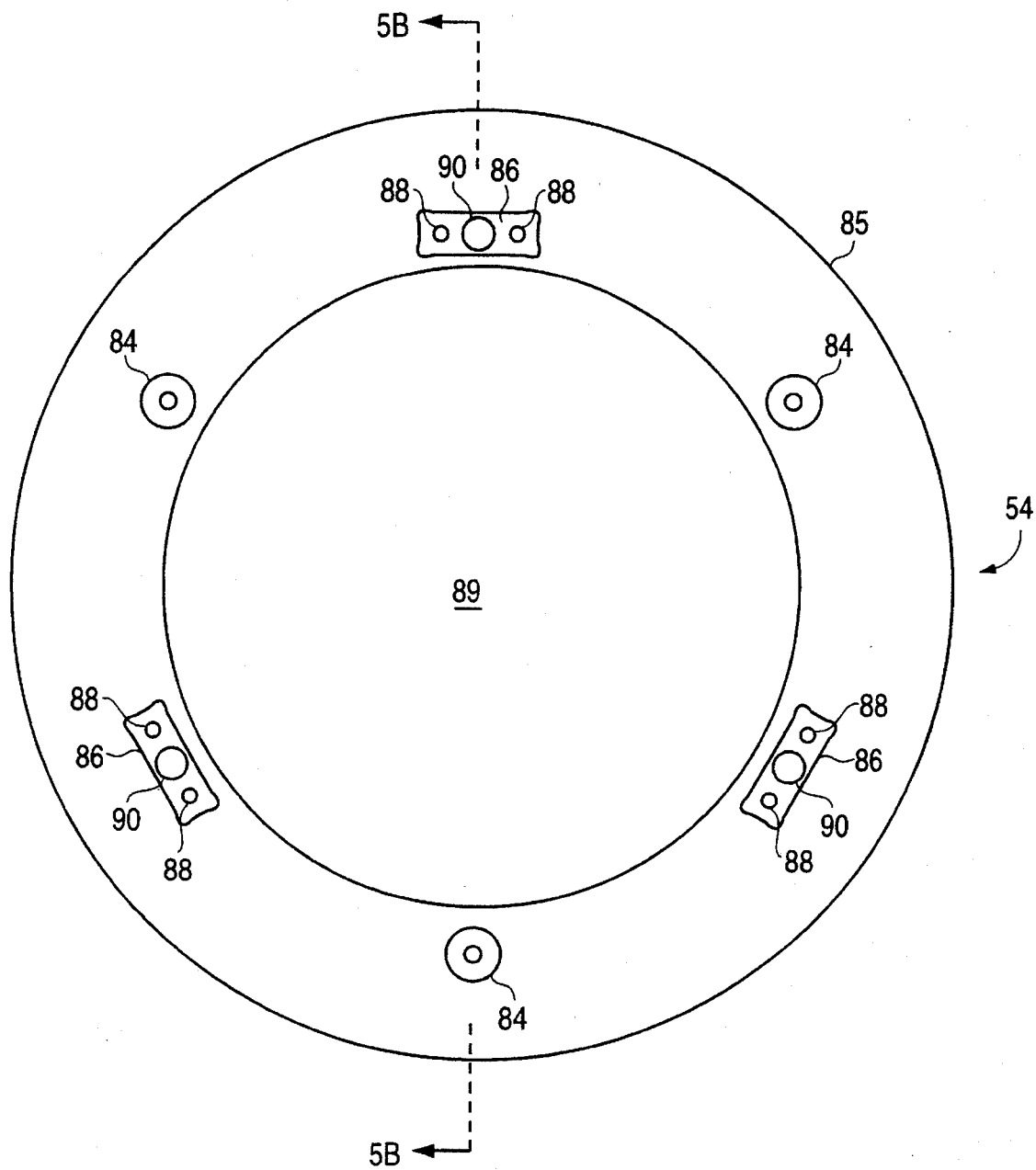
FIG. 5A is a view of the rotating dark space shield of FIGS. 2 and 3 taken along line 5A—5A of FIG. 3.
Figure 5B:
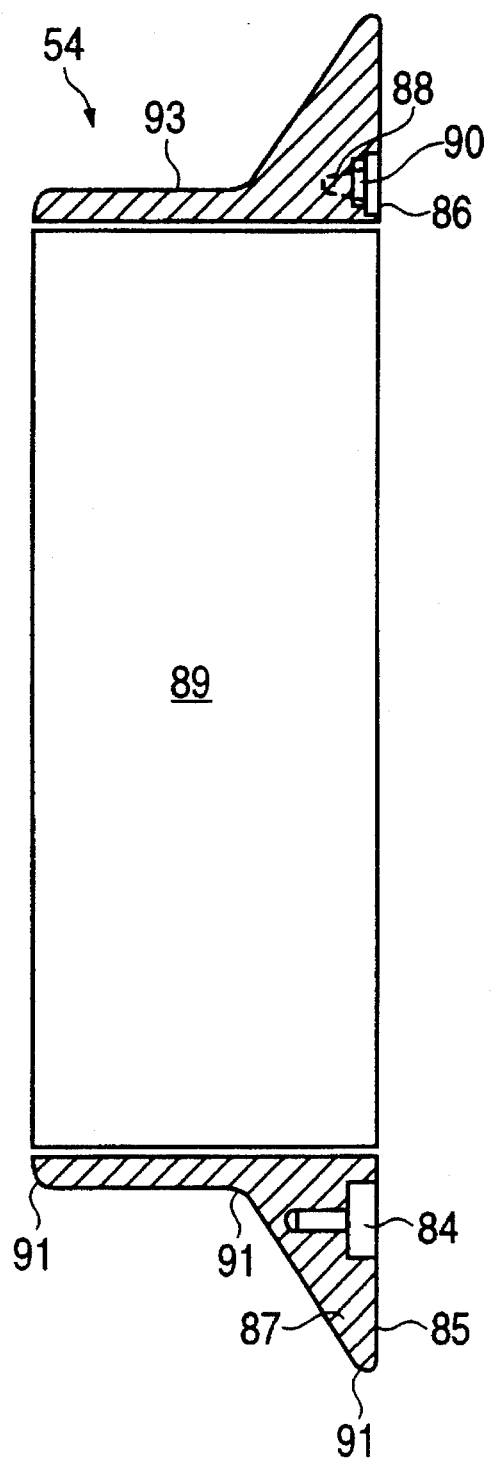
FIG. 5B is its cross-sectional view taken along line 5B—5B of FIG. 5A.

As shown in FIGS. 5A and 5B, the rotating dark space shield 54 has an opening 89, of which the diameter is sufficiently large to accommodate the tubular portion of the cathode 52 with a clearance equal to the dark space length. The shield 54 has a base 85 which faces the cathode mounting flange 50 when mounted. In order to reduce the tendency of deposited material to spall off the shield 54, it is advantageous for the shield 54 to have rounded edges 91 and a brim section 87 of generally-triangular cross-section near the base 85. There is a generally cylindrical part 93 protruding from the base 85 away from the flange 50. Three circular recesses 84 are provided in the base 85 for the stand-off insulators 58 shown in FIG. 3. Three rectangular recesses 86 are also provided in the base 85 for the pin retainers 62. Three round recesses 90 are further provided inside the rectangular recesses 86 for the base parts of the lock pins 60 (shown in FIG. 3). Each of the rectangular recesses 86 is also provided with two threaded holes 88 on either side of the round recess 90. These holes 88 and two matching tapered holes in the pin retainer 62 are used for bolting the pin retainers 62 into the recesses 86. Each lock pin 60 passes through a hole of its retainer 62 and is held with its base 60a held between the base 84 and the retainer 62 inside the recess 90. As shown (although not in detail) in FIG. 3, the lock pins 60 have a body member with a tapered end 60b to facilitate insertion into the socket 64 and a neck 60c which, when the dark space shield 54 is mounted, is engaged by a matching bore of the socket 64. The sockets 64 also have a base 64a for retention inside the recesses 63 of the cathode mounting flange 50 and a groove for the O-ring 66 for improved pin retention. The sockets 64 are made of an electrically-insulating material such as nylon such that the dark space shield 54 is electrically floating relative to the cathode 52.

More detailed descriptions of other components such as the retainers 62, the lock pins 60 and the sockets 64 are given in U.S. patent application Ser. No. 08/174,533 filed Dec. 30, 1993, of which this application is a continuation-in-part, the entire disclosure of which is hereby incorporated by reference.

Figure 6A:
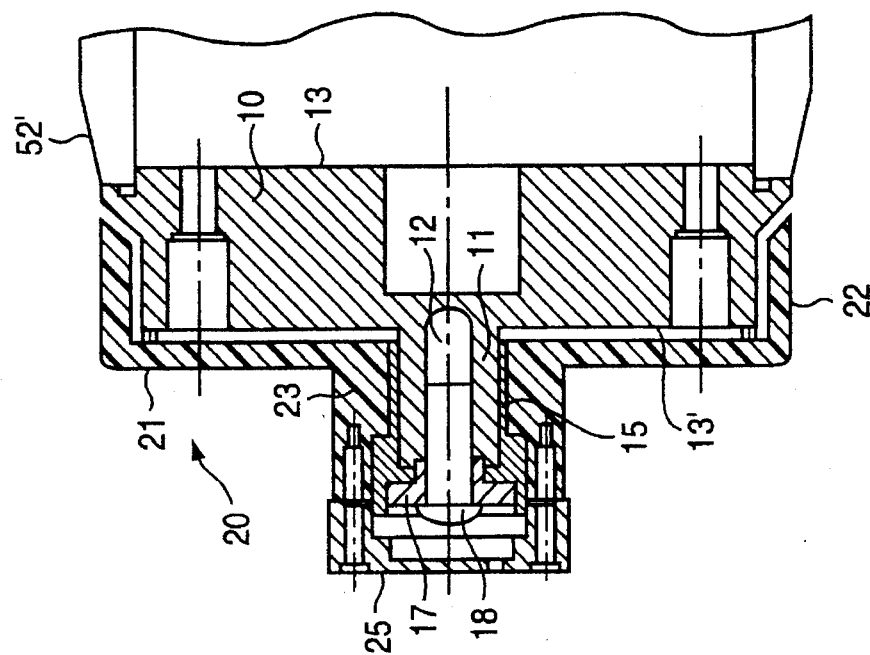
FIG. 6A is a cross-sectional view of the spring-loaded mounted end portion of the cathode of FIGS. 1 and 4.
Figure 6B:
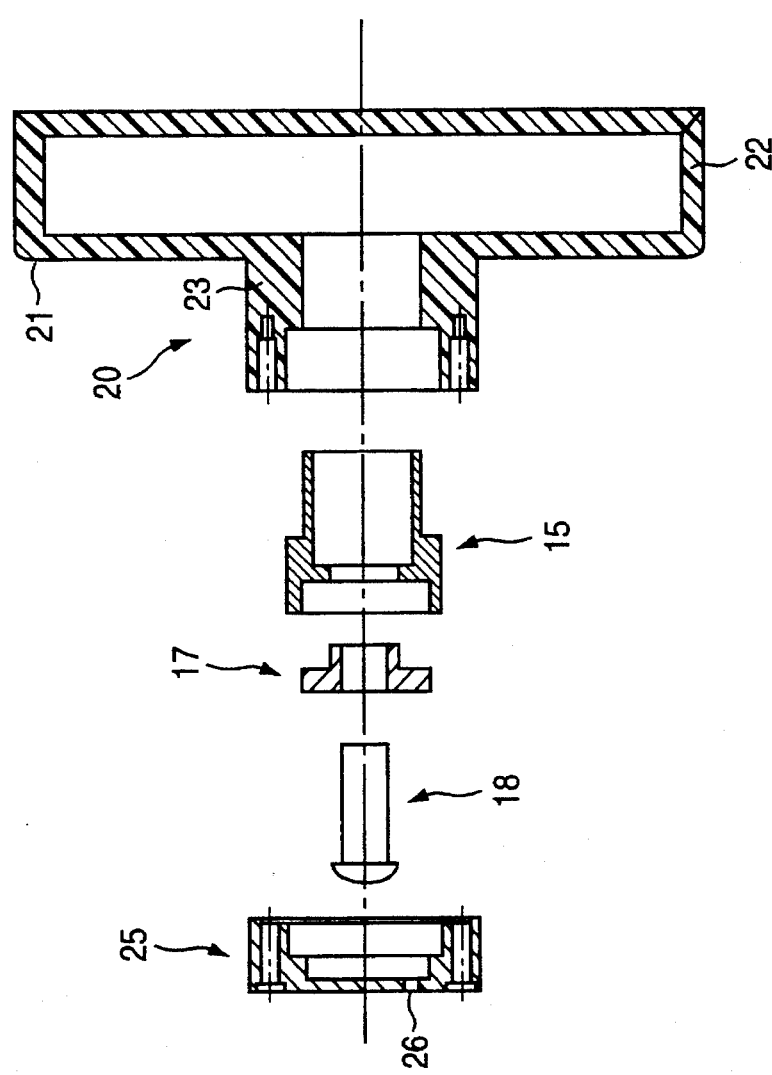
FIG. 6B is an exploded view of FIG. 6A.

FIGS. 1, 6A and 6B show the spring-loaded mounted end of the tubular part of the cathode 52 distal from the flange 50 and the drive shaft 68. This end part may be characterized briefly as having a front end flange 10 covered by, but not in direct contact with, another dark space shield 20 (hereinafter to be referred to as "the front dark space shield" or simply "the front shield" in order to distinguish from the dark space shield 54 described above). The front end flange 10 has a generally disk-shaped base 13 with a generally flat front surface 13' and a cylindrical part 11 protruding axially (with respect to the cylindrical part of the cathode 52) forward (to the left with reference to FIG. 6A) from the center of the base 13.

The front shield 20 has a circular disk-shaped base part 21 adapted to be positioned in a face-to-face but electrically non-conducting relationship witch, and separated by a well-controlled distance less than the dark space length from, the front surface 13' of the base 13 of the front end flange 10 when the front shield 20 is properly mounted, as will be discussed below. The front shield 20 has a peripheral cylindrical tubular part 22 (referred to as the sleeve) protruding backwards towards the cathode 52 from the outer periphery. The sleeve 22, however, is below a line of sight from the cathode surface such that growth of any sputtered coating thereon will be prevented. For this purpose, the external diameter of the sleeve 22 is smaller than that of the cylindrical part of the cathode 52, whose end 52' is tapered. Since the sleeve 22 is intended to cover the front surface of the base 13 of the front end flange 10, the base 13 has a frustoconical part such that its outer diameter at the front surface is even smaller than the inner diameter of the sleeve 22, as shown in FIG. 6A.

A tubular part 23 with a cylindrical inner surface protrudes forward axially from the disk-shaped base part 21 of the front shield 20, such that the cylindrical part 11 protruding from the front end flange 10 can be inserted and engage rotatably with the inner cylindrical surface of the tubular part 23 of the front shield 20 with a tubular insulator bearing 15 made, say, of Vespel® polyimide inserted in between. To effect this engagement, the cylindrical part 11 of the front end flange 10 is provided with a screw-accepting hole 12 in the axial direction, a thrust washer 17 of a steel material is inserted from the front into the Vespel® insulator bearing 15, and a steel screw 18 is passed through this washer 17 and further into the screw-accepting hole 12 of the front end flange 10 of the cathode 52 so as to support the front end flange 10 rotatably therearound. Thus, the front dark space shield 20 can rotate around bearing 15 relative to cathode 52, and hence the cathode 52 can be rotated freely while the shield 20 remains stationary. A circular steel cover piece 25 with a vent hole 26 therethrough is mounted onto and fastened to the tubular part 23 of the shield 20. Vent hole 26 is used to evacuate the space covered by cover piece 25.

Figure 7B:
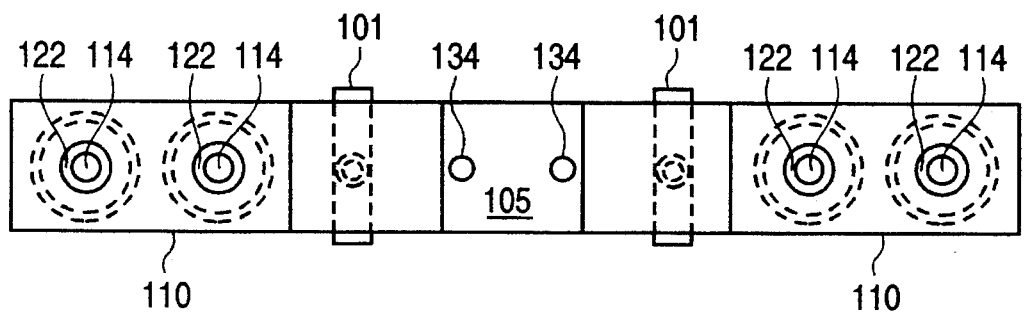
FIG. 7B is a plan view taken along line 7B—7B in FIG. 7A.

In order to relieve stress on bearings when sputtering with extremely heavy cathodes, such as those having a niobium target material, the cathode 52 according to this invention is supported at its free end from below by a yoke 100 of the spring-loaded mount 111, as shown in FIG. 2. Both arms of the yoke 100 are provided with Vespel® insulator buttons 101 (FIGS. 7A–7C) which are used as spacers to separate shield surface 21 from yoke 100 and, together with Vespel® insulator pad 105 by which the cover piece 25 of front shield 20 is supported, prevent electrical contact between yoke 100 and shield 20. Thus, the frontal dark space shield 20 is insulated from yoke 100 and floats electrically. Each insulator button 101 is attached to yoke 100 using a set-screw and screw accepting hole 136. Pad 105 is bolted onto yoke 100 using holes 134 of the pad and screw accepting holes 132 of the yoke.

Figure 7A:
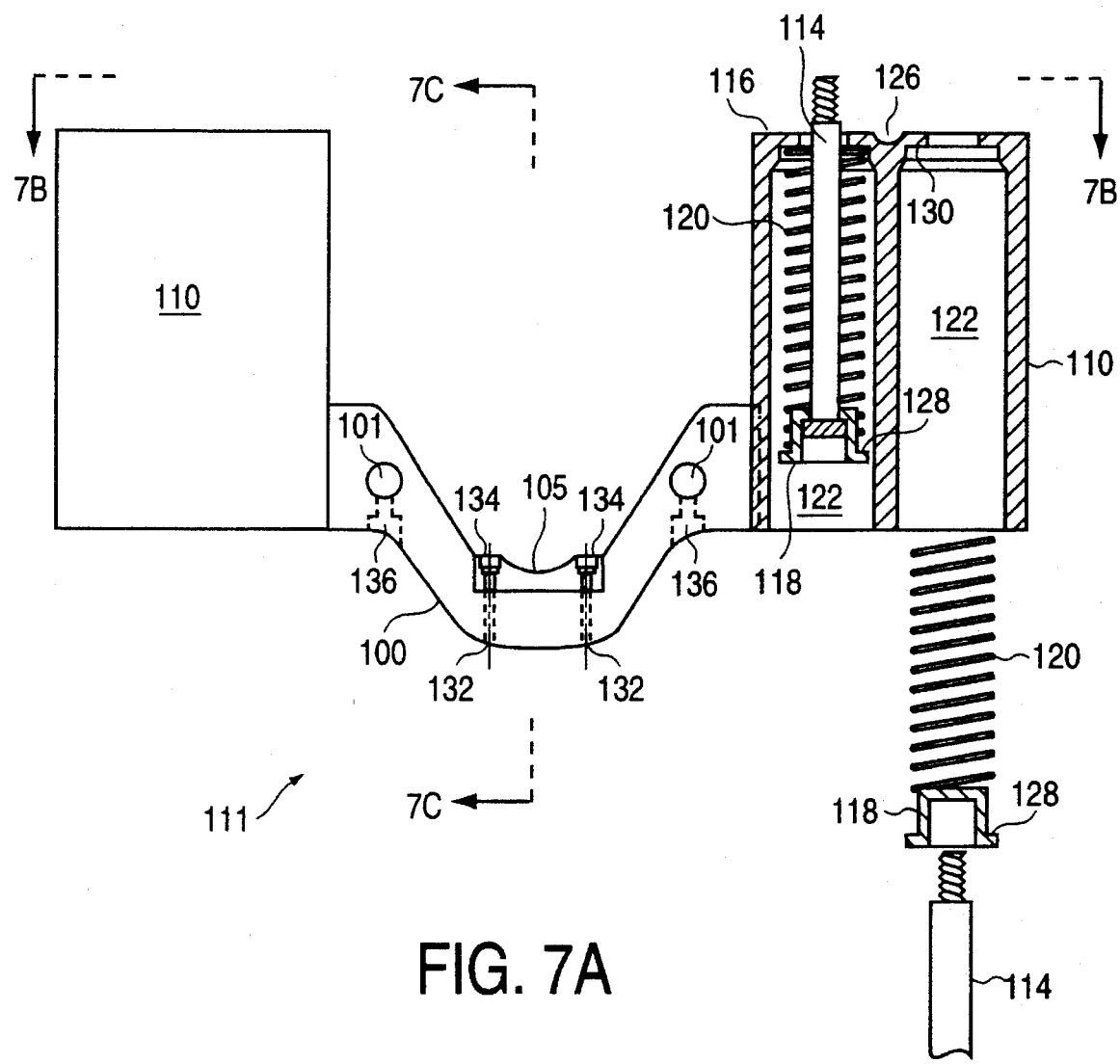
FIG. 7A is a partial cross-sectional and exploded view of the spring-loaded mount of FIGS. 1 and 2.
Figure 7C:
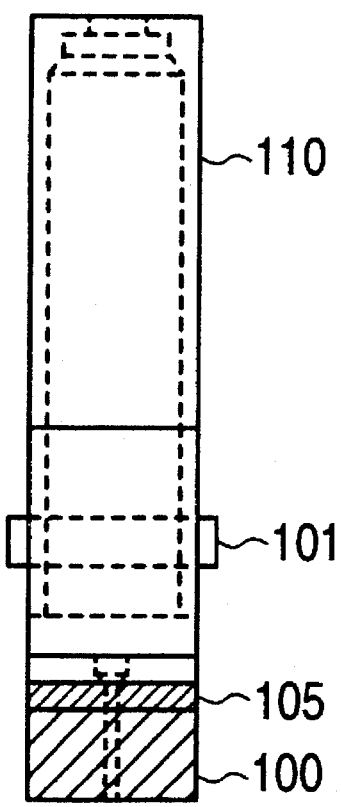
FIG. 7C is a cross-sectional view taken along line 7C—7C of FIG. 7A.

Yoke 100 is welded to a pair of spring loaded supporting devices 110 attached to a bar 112 (FIG. 2) which is in turn attached to the wall of sputtering chamber 41. As shown in FIG. 7A, Where one of the two identical supporting devices 110 is shown in cross-section, each device 110 has a housing 116 with two generally cylindrical cavities 122. Near the top of cavities 122, their diameter decreases to form a horizontal surface 130 for engaging the top of springs 120. The bottoms of springs 120 rest against surface 128 of supports 118. Supports 118 are held by bolts 114 which are bolted to bar 112 as shown in FIG. 1. The diameter of cavities 122 is larger than the diameter of bolts 114 such that housing 116 can move laterally while being supported vertically by springs 120. This allowance for lateral movement of housing 116 permits radial displacement of cover piece 25 and thus of the entire spring-loaded mounted end of cathode 52. As a result, the stresses on the drive shaft bearings are reduced.

Springs 120 must withstand the high temperatures present near the gas discharge, which dissipates power on the order of 100 kW. A suitable material for springs 120 is 18-8 stainless steel alloy.

As shown in FIGS. 2 and 7A, housing 116 has a dimple 126 on its top surface. Dimple 126 is positioned underneath a threaded hole 124 in bar 112. Hole 124 and dimple 126 allow lowering of yoke 100 to release cover piece 25, by threading a bolt through hole 124 and using it to press against dimple 126 to lower housing 116 with respect to bar 112.

In summary, a rotatable magnetron cathode according to this invention has a dark space shield attached both at its drive end where it is connected to the drive shaft of its drive motor and at its opposite and free end such that the gap between these shields and the cathode can be reliably controlled. Moreover, a spring loaded-mounting mechanism is provided at the cathode's free end. The spring-loaded mounting mechanism includes insulator buttons and a pad so as to reliably maintain the front shield in an electrically floating condition. The spring-loaded mount assembly reduces the load on the bearings caused by the magnetron weight as the cathode rotates. The spring-loaded mount also allows radial displacement of the free end of the cathode without stressing the bearings.

The present invention has been described in terms of a preferred embodiment. The invention, however, is not limited to the embodiment depicted and described. Rather, the scope of the invention is defined by the appended claims.

What is claimed is:

1. A rotating magnetron cathode apparatus, comprising:
    a cylindrical tubular structure with a first end which is rotatably supported and a second end which is distal from said first end;
    a frontal dark space shield at said second end of said cylindrical tubular structure;
    mounting means for rotatably mounting said frontal dark space shield onto said second end of said cylindrical tubular structure without electrical conduction therebetween and such that said frontal dark shield remains stationary while said cylindrical tubular structure rotates; and
    said frontal dark space shield including a cylindrical tubular sleeve having an outer diameter less than a diameter of said cylindrical tubular structure.

2. The rotating magnetron cathode apparatus of claim 1 further comprising a rotating dark space shield mounted onto said cylindrical tubular structure around said first end so as to rotate together with said cylindrical tubular structure, there being no electrical conduction between said cylindrical tubular structure and said rotating dark space shield.

3. The rotating magnetron cathode apparatus of claim 1 wherein said frontal dark space shield comprises a circular disk part with an external surface, an internal surface opposite said external surface, and an externally protruding tubular part protruding from said external surface of said circular disk part, said mounting means including:
    a front flange having a base affixed to said cylindrical tubular structure at said second end and a cylindrical part protruding from said base; and
    a tubular insulator bearing inserted coaxially between said externally protruding tubular part of said frontal dark space shield and said cylindrical part of said front flange.

4. The rotating magnetron cathode of apparatus claim 3 wherein said base of said front flange has a frustoconical part.

5. The rotating magnetron cathode apparatus of claim 3 wherein said base of said front flange and said internal surface of said circular disk part are separated by a distance less than a dark space length.

6. The rotating magnetron cathode apparatus of claim 3 wherein said sleeve protrudes from peripheries of said internal surface of said circular disk part and wherein said outer diameter of said sleeve is greater than the diameter of said base of said flange so said sleeve covers said second end of said tubular structure.

7. The rotating magnetron cathode apparatus of claim 3 wherein said mounting means further include a cover piece attached to said externally protruding tubular part of said frontal dark space shield.

8. The rotating magnetron cathode apparatus of claim 3 wherein said cylindrical part of said front flange has a screw-accepting hole axially formed therethrough, said mounting means further including a washer which is attached to said tubular insulator bearing and a screw which is passed through said insulator bearing and is inserted into said screw-accepting hole.

9. A rotating magnetron apparatus comprising:
    an evacuable chamber;
    a drive shaft;
    a cathode disposed inside said evacuable chamber having a first end detachably attached to said drive shaft and a second end distal from said first end;
    a frontal dark space shield at said second end of said cathode;
    spring loaded supporting means attached to a wall of said chamber for vertically supporting said second end of said cathode while allowing radial displacement of said second end; and
    mounting means for rotatably mounting said frontal dark space shield onto said cathode without electrical conduction therebetween.

10. The rotating magnetron apparatus of claim 9 wherein said spring loaded supporting means include:
    a pair of spring loaded supporting devices attached to said chamber wall;
    a yoke which is suspended from said pair of supporting devices; and
    an insulating pad placed between said yoke and said frontal dark space shield.

11. The rotating magnetron apparatus of claim 10 wherein said yoke includes insulating members, said yoke being suspended from said pair of supporting devices through said insulating members.

12. The rotating magnetron apparatus of claim 11 wherein said frontal dark space shield comprises a circular disk part with an external surface, an internal surface opposite said external surface, and an externally protruding tubular part protruding from said external surface of said circular disk part, said mounting means including:

a front flange having a base affixed to said cylindrical tubular structure at said second end and a cylindrical part protruding from said base; and a tubular insulator bearing inserted coaxially between said externally protruding tubular part of said frontal dark space shield and said cylindrical part of said front flange.

13. The rotating magnetron apparatus of claim 12 wherein said mounting means further include a cover piece attached to said externally protruding tubular part of said frontal dark space shield, said yoke supporting said cylindrical cathode by contacting said cover piece with said insulating pad therebetween.

14. The rotating magnetron apparatus of claim 10 wherein said frontal dark space shield comprises a circular disk part with an external surface, an internal surface opposite said external surface, and an externally protruding tubular part protruding from said external surface of said circular disk part, said mounting means including:

a front flange having a base affixed to said cylindrical tubular structure at said second end and a cylindrical part protruding from said base;

a tubular insulator bearing inserted coaxially between said externally protruding tubular part of said frontal dark space shield and said cylindrical part of said front flange.

15. The rotating magnetron apparatus of claim 14 further including a cover piece attached to said externally protruding tubular part of said frontal dark space shield, said yoke supporting said cylindrical cathode by contacting said cover piece with said insulating pad therebetween.

16. The rotating magnetron apparatus of claim 9 wherein said frontal dark space shield comprises a circular disk part with an external surface, an internal surface opposite said external surface, and an externally protruding tubular part protruding from said external surface of said circular disk part, said mounting means including:

a front flange having a base affixed to said cylindrical tubular structure at said second end and a cylindrical part protruding from said base; and a tubular insulator bearing inserted coaxially between said externally protruding tubular part of said frontal dark space shield and said cylindrical part of said front flange.

17. The rotating magnetron apparatus of claim 12 wherein said mounting means further include a cover piece attached to said externally protruding tubular part of said frontal dark space shield, said spring loaded supporting means supporting said cylindrical cathode by contacting said cover piece.

18. A rotating magnetron apparatus comprising:

an evacuable chamber;

a drive shaft;

a cathode disposed inside said evacuable chamber having a first end detachably attached to said drive shaft and a second end distal from said first end; and spring loaded supporting means attached to a wall of said chamber for vertically supporting said second end of said cathode while allowing radial displacement of said second end.

19. The rotating magnetron apparatus of claim 18 wherein said spring loaded supporting means include:

a pair of spring loaded supporting devices attached to said chamber wall;

a yoke which is suspended from said pair of supporting devices; and an insulating pad placed between said yoke and said second end of said cathode.

20. The rotating magnetron apparatus of claim 19 wherein each said spring-loaded supporting device comprises:

a housing having at least one cavity having an opening at a top of said housing;

in each said cavity, means passing through said opening for connection to a chamber wall; and in each said cavity, a spring connecting said housing and said means for connection to said chamber wall.

21. A rotating magnetron cathode apparatus, comprising:

a cylindrical tubular structure with a first end that is rotatably supported and a second end that is distal from the first end;

a frontal dark space shield including a circular disk part with an external surface and an externally protruding tubular part protruding from said external surface;

a front flange having a base affixed to said cylindrical tubular structure at said second end and a cylindrical part protruding from said base; and a tubular insulator bearing disposed coaxially between said externally protruding tubular part of said frontal dark space shield and said cylindrical part of said front flange so that said frontal dark space shield is rotatably mounted at said second end.

* * * * *